United States Patent [19]

Yamamura et al.

[11] Patent Number: 4,665,497
[45] Date of Patent: May 12, 1987

[54] ELECTRONIC ODOMETER

[75] Inventors: Hirohisa Yamamura, Hitachiohta; Shotaro Naito; Kozo Katogi, both of Katsuta, all of Japan

[73] Assignee: Hitachi, Ltd., Tokyo, Japan

[21] Appl. No.: 691,524

[22] Filed: Dec. 18, 1984

[30] Foreign Application Priority Data

Apr. 22, 1983 [JP] Japan .................................. 58-71643

[51] Int. Cl.⁴ .............................................. G01C 22/00
[52] U.S. Cl. .................................... 364/561; 235/95 R
[58] Field of Search ............. 364/424, 561; 235/95 R; 377/24

[56] References Cited

U.S. PATENT DOCUMENTS

| | | | |
|---|---|---|---|
| 4,031,363 | 6/1977 | Freeman et al. | 377/24 |
| 4,409,663 | 10/1983 | Becker et al. | 364/561 |
| 4,539,641 | 9/1985 | Kawashimo et al. | 364/561 |
| 4,559,637 | 12/1985 | Webber | 364/561 |

FOREIGN PATENT DOCUMENTS 56-84511  7/1981  Japan .................................. 235/95 R Primary Examiner—Gary Chin
Attorney, Agent, or Firm—Antonelli, Terry & Wands

[57] ABSTRACT

An electronic odometer employing a non-volatile memory is used to indicate the total distance traveled by a vehicle such as an automobile. The total distance traveled by the vehicle, calculated by an arithmetic unit 3 from signals from a pulse generator 1, is written piece-by-piece sequentially into a non-volatile memory 7 which has N locations for storing the data on total distance. To read the data, the maximum value of the total distance data is found from the N locations storing total distance data of the non-volatile memory 7. When the difference between the maximum value and the data item written immediately before the maximum value is equal to a preset distance, the maximum value is indicated as the total distance traveled on digital display unit 8.

6 Claims, 20 Drawing Figures

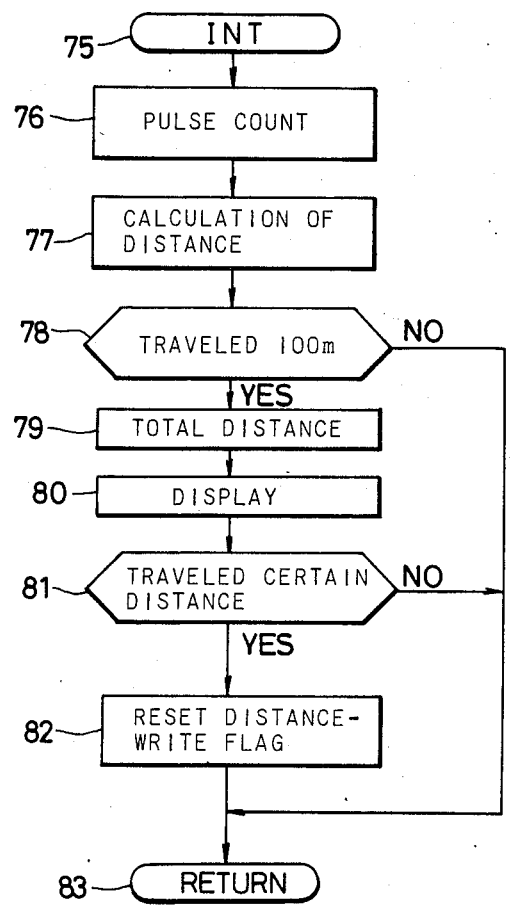

1

ELECTRONIC ODOMETER

TECHNICAL FIELD

The present invention relates to an electronic odometer, and particularly to an electronic odometer that is suitable for use in a vehicle such as an automobile.

BACKGROUND ART

Recently, proposals for an instrument indicating the total distance traveled by an automobile concern an electronic odometer employing non-volatile memories as a substitute for a mechanical instrument which indicates the total distance traveled by a vehicle.

An electronic odometer is powered by the battery of the automobile, and digitally displays the total distance traveled, which is integrated by a counter. According to this device, data on distance traveled is written into a plurality of non-volatile memories every 100 meters, and then that value is read out and indicated, in order to prevent loss of the data on distance traveled as integrated by the counter if the voltage should drop such as when the battery is changed or a wire breaks. At the moment, however, there is a limit on the number of times data can be written into non-volatile memories. With this method, therefore, the odometer can be used for only about ten thousand kilometers, although the automobile can, in practice, travel a total distance of more than a hundred thousand kilometers. One method of solving this problem is disclosed in Japanese Patent Laid-Open No. 95813/1980 laid open in Japan on July 21, 1980, and entitled "Odometer", and involves a method of reducing the number of times data is written into the non-volatile memories. Japanese Patent Laid-Open No. 93209/1977 laid open in Japan on June 10, 1982 and entitled "Odometer for Automobile" discloses a method in which the distance traveled is determined based upon a majority rule, by writing the distance traveled into a plurality of non-volatile memories and then reading the written data out of the non-volatile memories. In either case, data is written repeatedly into the same locations of non-volatile memories, data transfer is destroyed during the writing period (about 300 ms), so that incorrect data could be input to the non-volatile memories unless a large capacitor is provided to back up the power source or unless a large-capacity storage battery is provided.

DICSLOSURE OF INVENTION

An object of the present invention is to provide an electronic odometer which is capable of extending the life of non-volatile memories, and which is capable of correctly indicating the total distance traveled by the automobile.

Another object of the present invention is to provide an electronic odometer which is capable of utilizing non-volatile memories to the maximum, and which is also capable of extending the life thereof.

A further object of the present invention is to provide an electronic odometer which is capable of indicating the distance traveled by the automobile up to the moment that the engine is turned off.

The characteristic feature of the present invention resides in that the distance traveled by the automobile is written, after each predetermined distance traveled, into a location of a non-volatile memory which has N locations, $N_1$ to $N_N$, so that data on the total distance traveled is stored. This makes it possible to extend the life of the non-volatile memory, and correctly indicate the total distance traveled by the automobile, as described later.

BRIEF DESCRIPTION OF DRAWINGS

FIG. 18 is a flow chart of an embodiment of an interrupt processing program in the arithmetic unit of FIG. 10.

BEST MODE FOR CARRYING OUT THE INVENTION

Embodiment of the present invention will be described below in detail, in conjunction with the accompanying drawings.

Figure 1:
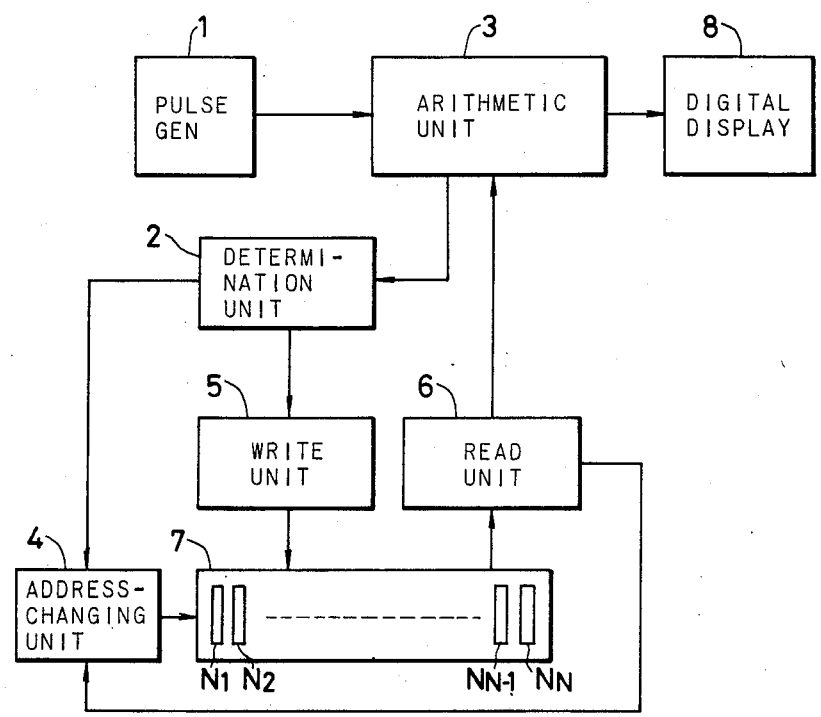
FIG. 1 is a basic block diagram of the present invention.

With reference to FIG. 1, in an electronic odometer of the present invention, data on distance traveled, such as vehicle-speed pulses, are generated by a pulse generator 1 and are input to an arithmetic unit 3 which calculates the distance traveled and the total distance traveled, and the calculated result is indicated by a digital display 8. When the power is turned on, when the data item which is the largest of data items at addresses $N_1$ to $N_N$ of a non-volatile memory 7 reaches a difference of a preset distance over the data items in neighboring addresses, it is input as a read-out value and as an initial value to the arithmetic unit 3. Therefore, the total distance traveled is obtained by adding the distance traveled (hereinafter referred to as the count) to the initial value. Data is written into the non-volatile memory 7 after each unit of a preset distance determined by a determination unit 2. A direct address system is employed in which the address is changed by an address-changing unit 4 so that it is replaced by the next address.

In this way, data is successively written into sequential address locations in the non-volatile memory 7. Compared with the conventional system in which data is written into the same address or data is written simultaneously into all of a plurality of addresses, all the data can be protected from erasure, even if one cycle is missed or an erroneous operation occurs. A read unit 6 is used to read out the data written into the non-volatile memory 7 and send it to the arithmetic unit 3.

Figure 2:
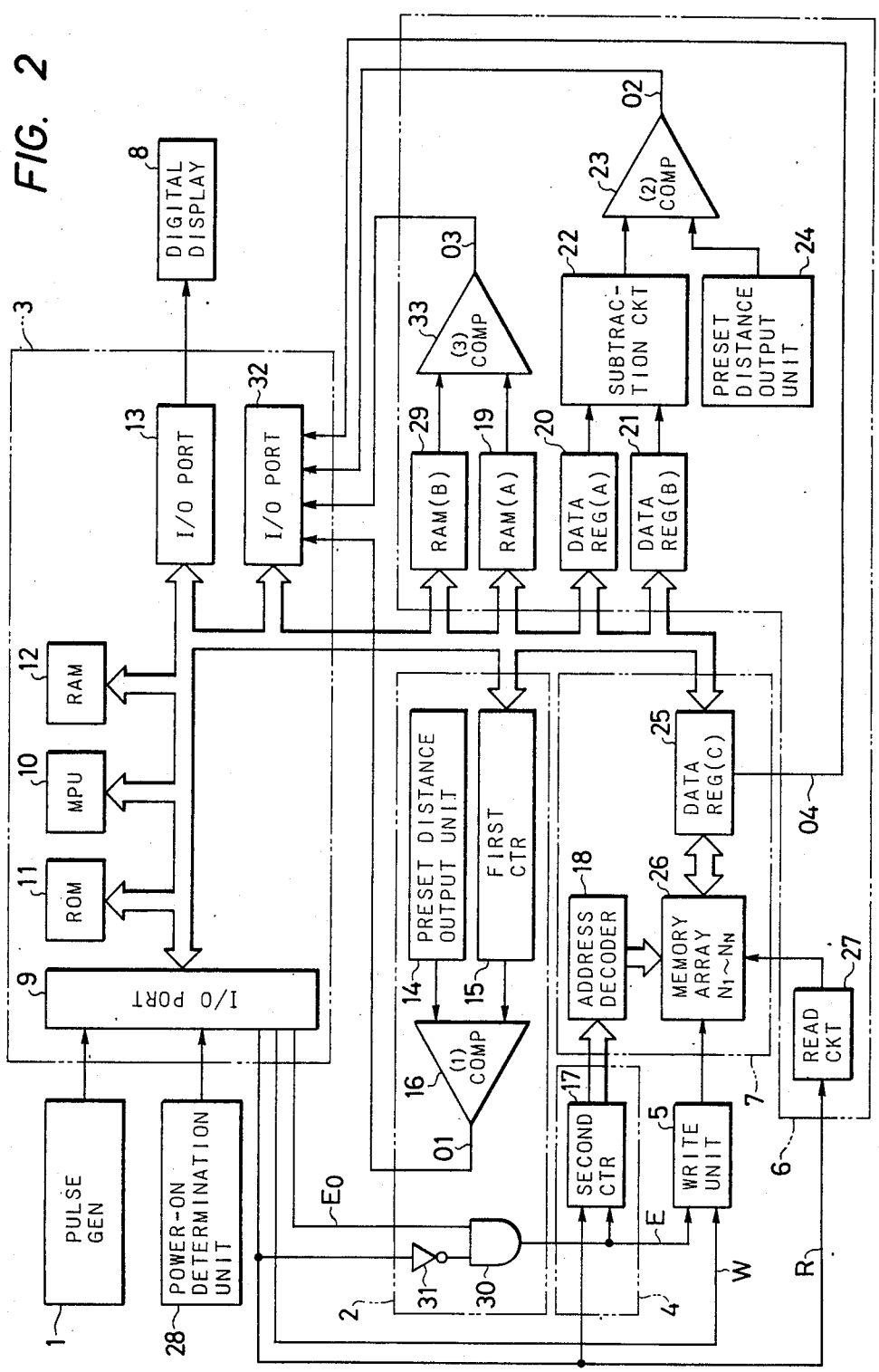
FIG. 2 is a diagram of a specific embodiment of FIG. 1.

FIG. 2 is a diagram illustrating a specific embodiment of FIG. 1. Data on distance traveled, such as vehicle-speed pulses, are generated by the pulse generator 1 and are input to an I/O port 9. The aritimetic unit 3 consists of a so-called microcomputer constituted by the I/O port 9, a ROM 11, and MPU 10, a RAM 12, an I/O port 13, and an I/O port 32. Input pulses are counted by the MPU 10 according to a program stored in the ROM 11. The count is temporarily stored in the RAM 12 together with the initial value and data on total distance traveled which is found by adding the count to the initial value.

Figure 3:
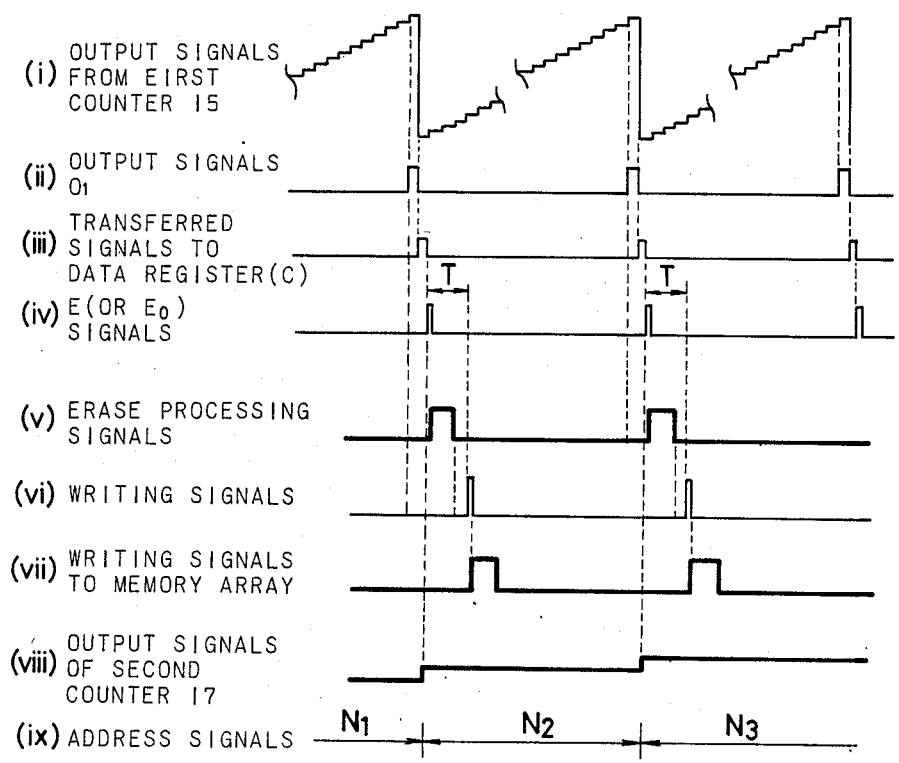
FIG. 3 is a timing chart illustrating the writing operation of the embodiment of FIG. 2.

The preset distance determination unit 2 consists of a preset distance output unit 14, a first counter 15, and a comparator 16, wherein the first counter 15 increments according to the result calculated by the MPU 10 every minimum operating unit (for example, every 100 meters). When the vehicle travels the preset distance, the first comparator 16 compares the output of the preset distance output unit 14 with the output of the first counter 15, and generates an output $O_1$, shown in FIG. 3(ii). The output $O_1$ is input to the I/O port 32 which informs the MPU 10 that the preset distance has been reached. The MPU 10 then transfers the data on the total distance traveled which is stored in the RAM 12, to a data register (C) 25. The I/O port 9 then outputs a pulse $E_0$, as shown in FIG. 3(iv), and an inverter 31 outputs an erase signal E if no output is generated by a power-on determination unit 28 or if the MPU 10 has not been reset. A second counter 17 increments in response to an output of an AND circuit 30. As a result, an address decoder 18 selects the next address. Erase processing is effected by the input of the erase signal E to a write unit 5. In response to an erase processing signal of FIG. 3(v), the data in the corresponding address is erased from a memory array 26. During this period, the MPU 10 stands by for a time T, and, after time T has elapsed, a writing signal W is output from the I/O port 9, as shown in FIG. 3(vi), and a write unit 5 writes the data in the data register 25 into the non-volatile memory at a predetermined address in a memory array 26, as shown in FIG. 3(vii). In this way, a series of write operations are executed. As shown in FIGS. 3(viii) and 3(ix), signals from the second counter 17 and the addresses $N_1, N_2, \ldots N_N$ are output in synchronism with the tranfer of data to the data register (C).

The data is read out from the non-volatile memory in response to a reading signal R from the I/O port 9 when there is an output from the power-on determination unit 28.

Figure 4:
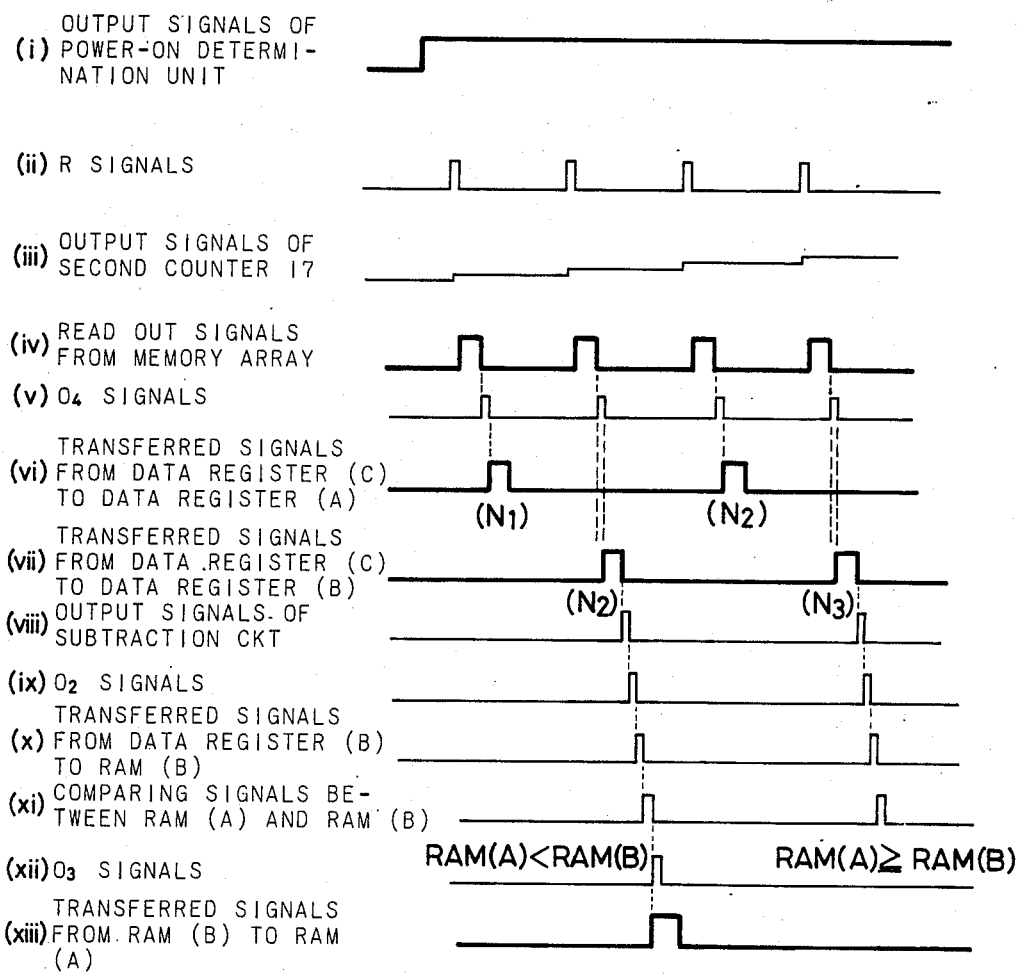
FIG. 4 is a timing chart illustrating the reading operation of the embodiment of FIG. 2.

First, the signal R is output from the I/O port 9 to increment the second counter 17, as shown in FIG. 4(iii). The next read address is then designated by the address decoder 18, and the memory at the designated address in the memory array 26 is read out by a read circuit 27, and that data is sent to the data register (C) 25, as shown in FIG. 4(iv). After the data read has been completed, a signal $O_4$ is input to the I/O port 32 to inform the MPU 10 that the read operation is completed. The data item $N_i$ is then transferred from the data register (C) to a data register (A) 20, as shown in FIG. 4(vi). The signal R is again output from the I/O port 9 to increment the second counter 17, and data item $N_{i+1}$ in the next address is read and sent to the data register (C) 25 in the same way. The data is then transferred to a data register (B) 21, as shown in FIG. 4(vii), a subtraction circuit 22 is operated and its output is compared by a second comparator 23 with the output of a preset distance output unit 24. When the output is equal to the preset distance, a signal $O_2$ is output, as shown in FIG. 4(ix), to the I/O port 32, the MPU 10 is informed, and the value in the data register (B) is then transferred to a RAM (B) 29. Next, as shown in FIG. 4(xi), a third comparator 33 compares a RAM (A) 19 with RAM (B) 29 and generates an output signal $O_3$. When the value in RAM (A) is less than that in RAM (B), as shown in FIG. 4(xiii), the maximum value of RAM (B) is input to RAM (A) 19. This process is executed until all the data has been read out of the memory. The value in RAM (A) is taken to be a read value, and is stored in the RAM 12 as an initial value for the total distance data. When RAM (A) $\geq$ RAM (B), the contents of RAM (B) are not transferred to RAM (A).

With the construction of FIG. 2, data on the total distance traveled is written successively into one of a plurality of locations $N_1$ to $N_N$ at which data on the total distance is stored in the non-volatile memory 7, every distance of 100 meters. Therefore, even if data written later is incorrect because of a problem during writing, data on the previous 100 meters remains. This means that the initial value of the total distance traveled can be set in the RAM 12 with an error of a distance of 100 meters. Although the limit for writing data into the non-volatile memory 7 is usually about ten thousand times, alternate use of N memories helps extend the life of the memory N times. In addition, since distance is recorded every 100 meters, a measurement error of more than 100 meters is not possible.

When reading out the data, furthermore, a second comparator 23 checks whether the difference between the maximum value in the data on total distance traveled and the data item stored just before that maximum value is equal to the preset distance, so that the measurement accuracy can be further increased.

Figure 5:
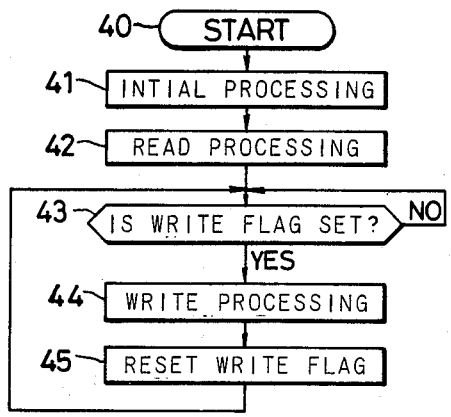
FIG. 5 is a flow chart of an embodiment of a main processing program in the arithmetic unit of FIG. 2.

With reference to FIG. 5, when the power is turned on in step 40, initial processing is executed in step 41 to set initial values in the registers and the memory, and processing is executed in step 42 to read out correct data from the non-volatile memory. The program then enters an ordinary processing loop. Step 43 checks whether data can be written into the RAM. When writing is enabled (a write flag is set), the program proceeds to the write processing of step 44. When data can not be written, the program goes to a stand-by condition, or the interrupt processing of FIG. 6 is executed.

Figure 6:
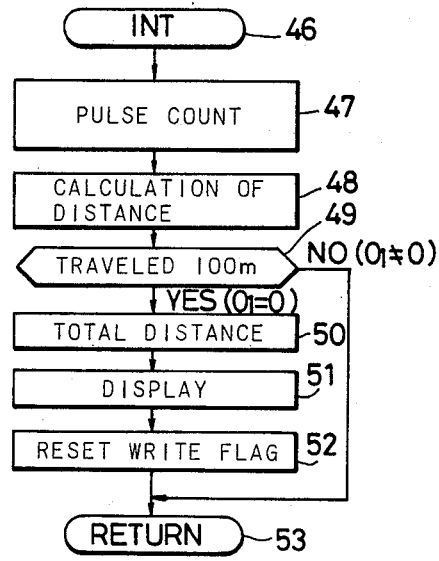
FIG. 6 is a flow chart of an embodiment of an interrupt processing program in the arithmetic unit of FIG. 2.

The interrupt processing shown in FIG. 6 is initiated with an interrupt step 46, the MPU 10 executes the pulse count and calculation of distance traveled in steps 47, 48, and in step 49, the first comparator generates an output signal $O_1$ every 100 meters. The MPU 10 calculates the total distance traveled in step 50, and an output from the I/O port 13 executes a display in step 51. Step 52 sets the write enable status in the main processing, and in step 53 the program returns to the point at which the interrupt was initiated in the main processing.

Figure 7:
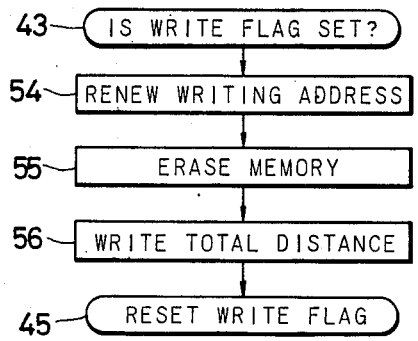
FIG. 7 is a flow chart of an embodiment of the write processing of FIG. 5.

The write processing shown in FIG. 7 corresponds to step 44 of FIG. 5. When the write flag of step 43 is set, the address decoder 18 renews the address in step 54. The write unit 5 erases the memory in step 55. In step 56, the distance traveled is written successively into locations $N_1$ to $N_N$ in the non-volatile memory 7 used for storing the total distance traveled, in the sequence of $N_1$ to $N_N$. If the data in memory 7 is not n times 100 meters after the write processing has finished, step 45 prevents the writing of data into the RAM 12.

Figure 8:
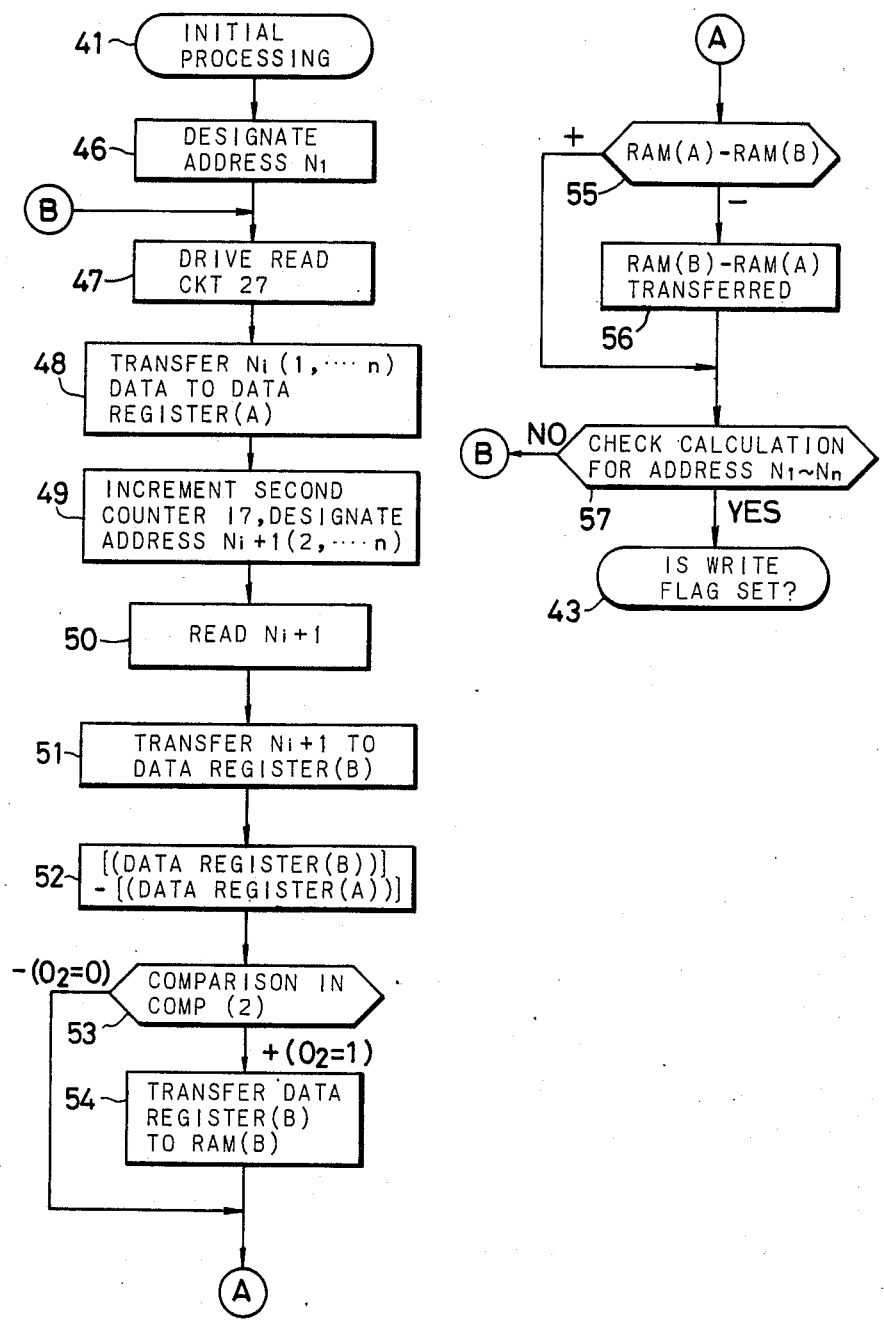
FIG. 8 is a flow chart of an embodiment of the read processing of FIG. 5.

The read processing shown in FIG. 8 corresponds to step 42 of FIG. 5. After the power is turned on, the address decoder 18 designates address $N_1$ of the non-volatile memory 7 at step 46. In step 47, the read circuit 27 is driven by the signal R, and in step 48, the data in address $N_1$ is transferred to the data register (A). In step 49, the address decoder 18 designates address $N_2$ of the non-volatile memory 7, the content of address $N_2$ is read in step 50, and is transferred in step 51 to the data register (B). In step 52, the content of data register (A) is subtracted from the content of data register (B), and the second comparator 23 performs its calculation in step 53. If the second comparator 23 generates a positive output, the content of data register (B) is transferred to RAM (B) 29 in step 54. After the content is transferred in step 54, or after the output of the second comparator 23 is determined to be zero in step 53, the calculation RAM (A)–RAM (B) is executed in step 55. If the result of the calculation in step 55 has a negative value, the content of RAM (B) is transferred to RAM (A). When the calculation RAM (A) –RAM (B) provides a positive after step 56 or in step 55, step 57 checks whether this calculation has been effected for all the addresses $N_1$ to $N_N$. When the answer obtained by step 57 is yes, a maximum value remains in RAM (A) for step 43. When the answer of step 57 is no, the above calculation is executed for $N_2$ and $N_3$, $N_3$ and $N_4$ ... $N_{N-1}$ and $N_N$, $N_N$ and $N_1$.

A so-called direct address system is employed in the non-volatile memory shown in FIG. 1 in which the data is stored in the memory in the order of $N_1$, $N_2$ ... $N_N$.

Figure 9:
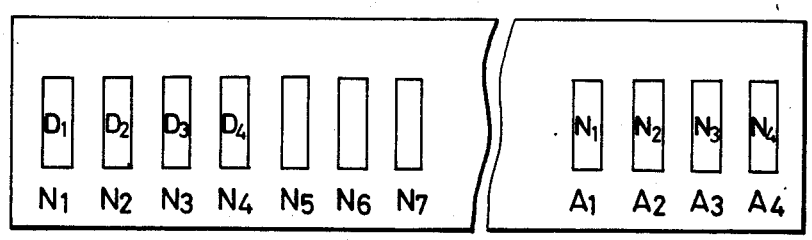
FIG. 9 is a diagram showing how the non-volatile memory of the present invention is used for another purpose.
Figure 10:
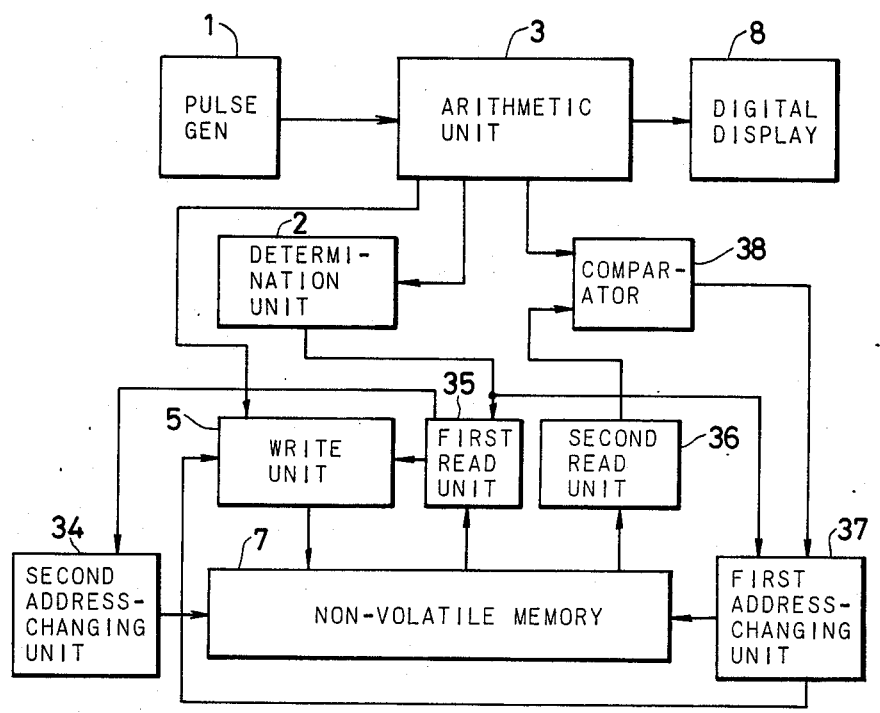
FIG. 10 is another basic block diagram of the present invention, in which the non-volatile memory is used for the purpose shown in FIG. 9.

FIG. 10 shows a second embodiment of the present invention. A so-called indirect address system is employed in the non-volatile memory of FIG. 10. The indirect address system used in the present invention is described below with reference to FIG. 9. In the indirect address system, the memory is divided into locations $N_1$ to $N_4$ for storing data and locations $A_1$ to $A_4$ for storing addresses. The locations $A_1$ to $A_4$ for addresses are first read out, and then the addresses $N_1$ to $N_4$ corresponding to the contents thereof are read again.

Figure 11:
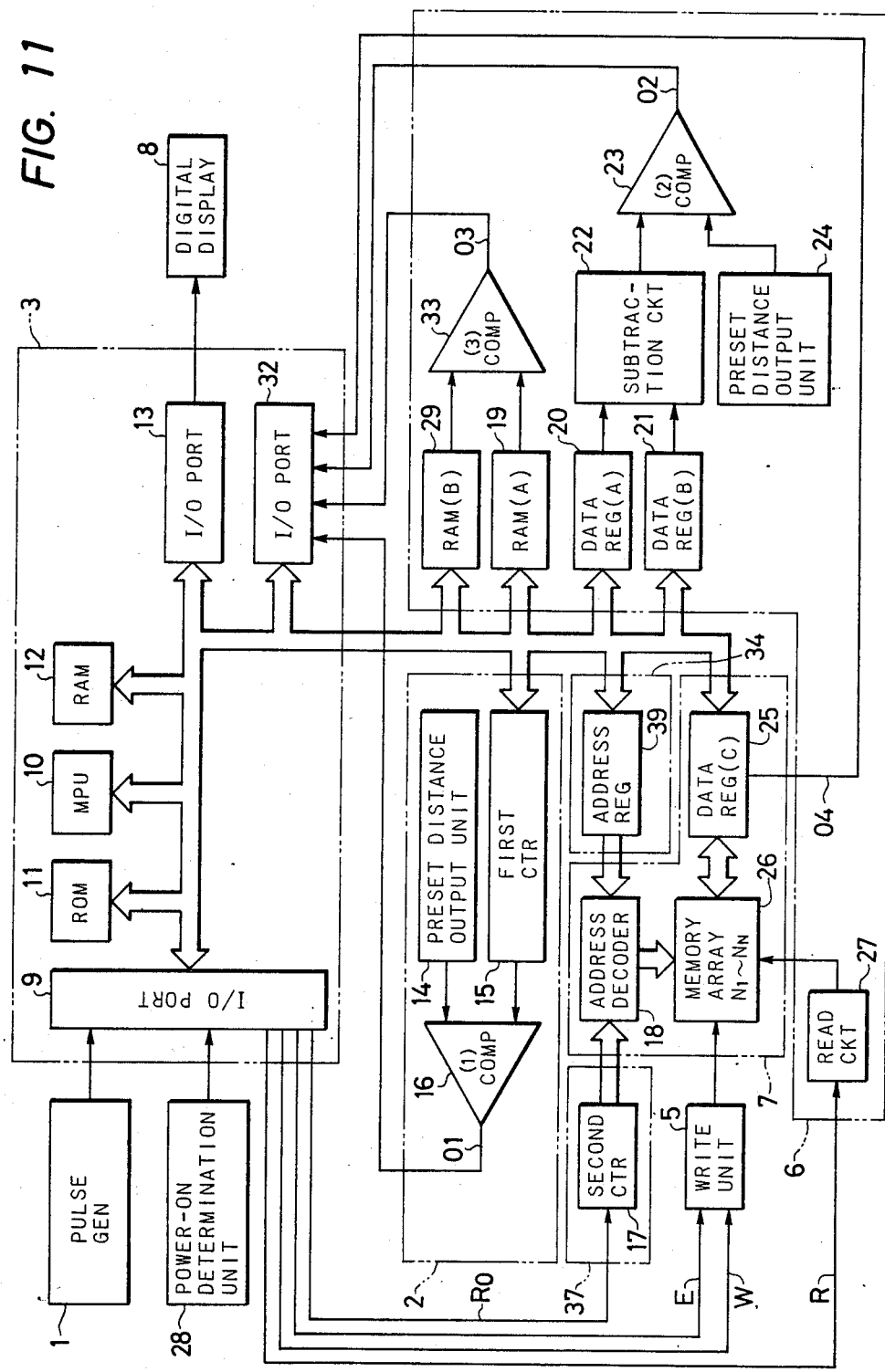
FIG. 11 is a diagram of a specific embodiment of FIG. 10.
Figure 12:
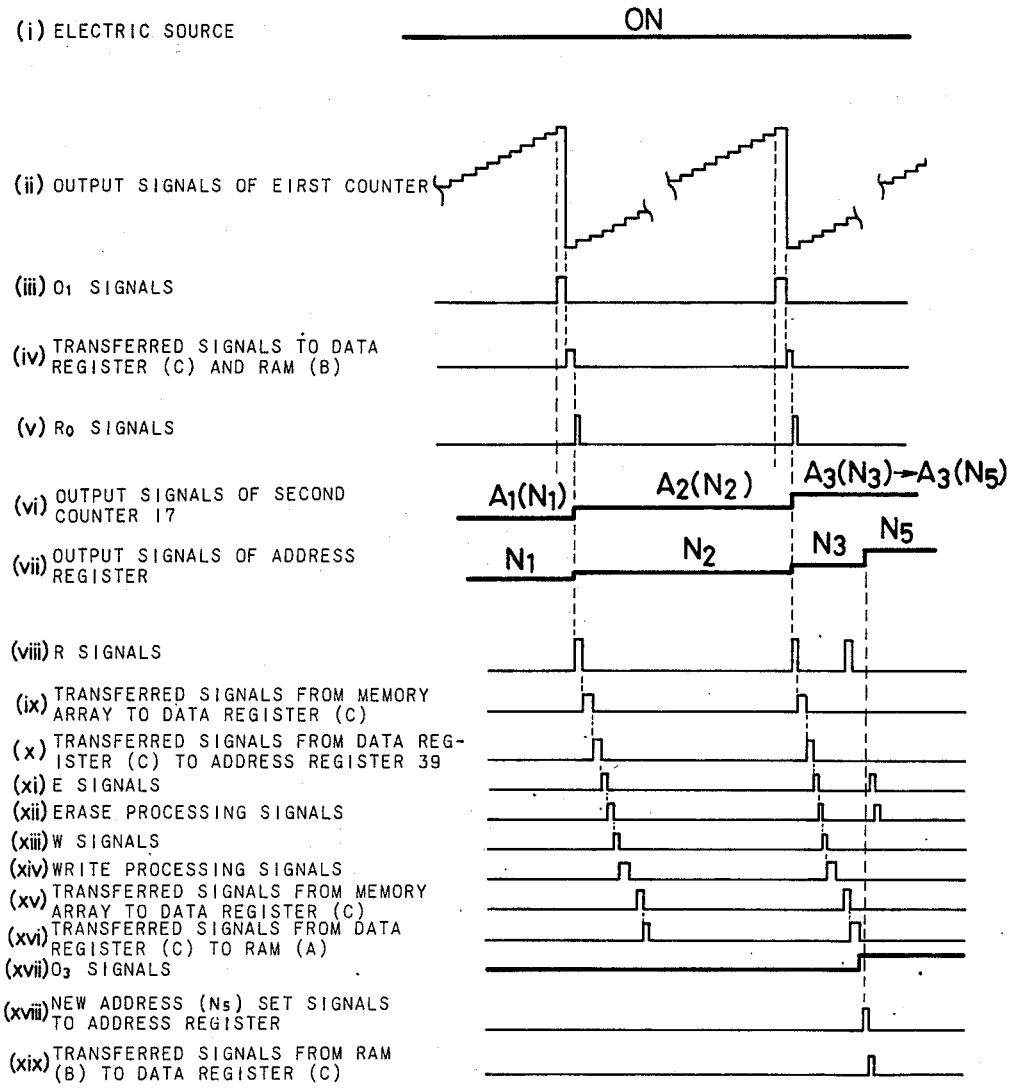
FIG. 12 is a timing chart illustrating the writing operation of the embodiment of FIG. 11.

What makes the electronic odometer of FIG. 10 different from the electronic odometer of FIG. 1 is the provision of first and second read units 35, 36, and first and second address-changing units 37, 34. The first address-changing unit 37 is used to change the indirect addresses $A_1$ to $A_7$, and the second address-changing unit 34 is used to change the direct addresses $N_1$ to $N_4$. In the electronic odometer of FIG. 10, the first address-changing unit 37 designates indirect addresses $A_1$ to $A_4$ in response to the output of the preset distance determination unit 2, so that the first read unit 35 reads from the non-volatile memory 7 the direct addresses $N_1$ to $N_4$ from the storage locations indicated by the indirect addresses $A_1$ to $A_4$. The direct addresses $N_1$ to $N_4$ are then input to the second address-changing unit 34, and the write unit 5 writes the result calculated by the arithmetic unit 3. After the calculation result is thus written, the second read unit 36 reads the thus-written value, and a comparator unit 38 compares it with the previous value, and, only when these values are not equal, the content of the address indicated by the first address-changing unit is renewed to designate a new area for the writing of data. FIG. 11 is a diagram of a specific embodiment of FIG. 10. What makes this embodiment different from the embodiment of FIG. 2 is that an address register 39 for changing the direct addresses is provided, and the second counter 17 is operated by a signal $R_0$. FIG. 12 is a timing chart illustrating the operation of the embodiment of FIG. 10. This operation will be described below with reference to FIG. 12.

The first counter 15 increments as the distance traveled increases, as described earlier with reference to FIG. 3, and generates an output $O_1$ when a preset distance is traveled, as shown in FIG. 12(iii) so that the data on total distance traveled in the RAM 12 is transferred to the data register (C) 25 and the RAM (B) 29. The I/O port 9 then generates a signal $R_0$, and the second counter 17 is incremented to select the address $A_1$. Then, in response to a signal R, the direct address $N_1$ corresponding to the indirect address $A_1$ is read out from the memory array 26, and is transferred from the data register (C) 25 to an address register 39. This address is set to $N_1$ by the address decoder 18, a signal E is generated to execute erase processing, and then a signal W is generated to write the data into the memory array 26. Thereafter, the signal R is immediately generated for the read processing, and data is transferred to the RAM (A) 19.

Next the content of RAM (A) is compared with that of RAM (B), and, only when they are not equal, the content of the address specified by the first address-changing unit 37, i.e., that indicated by the second counter 17, is renewed from $N_3$ to $N_5$, as shown in FIG. 12(vii), to prevent the use of a defective area of the memory, and the data is rewritten into the new address.

With this method, the memory can be used to the maximum until it becomes defective, and its life can be extended.

Figure 13:
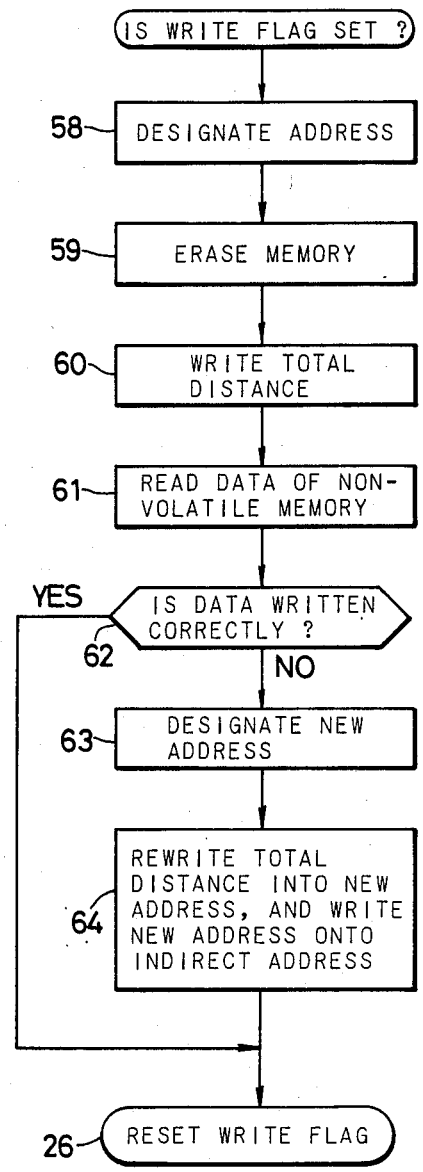
FIG. 13 is a flow chart of an embodiment of the write processing in the arithmetic unit of FIG. 11.

The flow charts of the main processing, interrupt processing and read processing of the arithmetic unit of FIG. 11 are the same as those of FIGS. 5, 6, and 8. The write processing of the arithmetic unit of FIG. 11 is executed according to FIG. 13. In FIG. 13, step 58 is executed by the second counter 17, and steps 59 and 60 are executed by the input of signals E and W to the write unit 5. Step 61 confirms the writing, and is executed by the input of signal R to the read circuit 27. Step 62 is executed by a third comparator 33, if the answer obtained by step 62 is yes, step 26 resets the write flag. However, if the answer of step 62 is no, the address register 39 designates the area for a new direct address in step 63. In step 64, the total distance is rewritten into the new direct address by the address register 39 and the write unit 5, and simultaneously the new, changed address is written onto the corresponding indirect address by the second counter 17 and the write unit 5.

Figure 14:
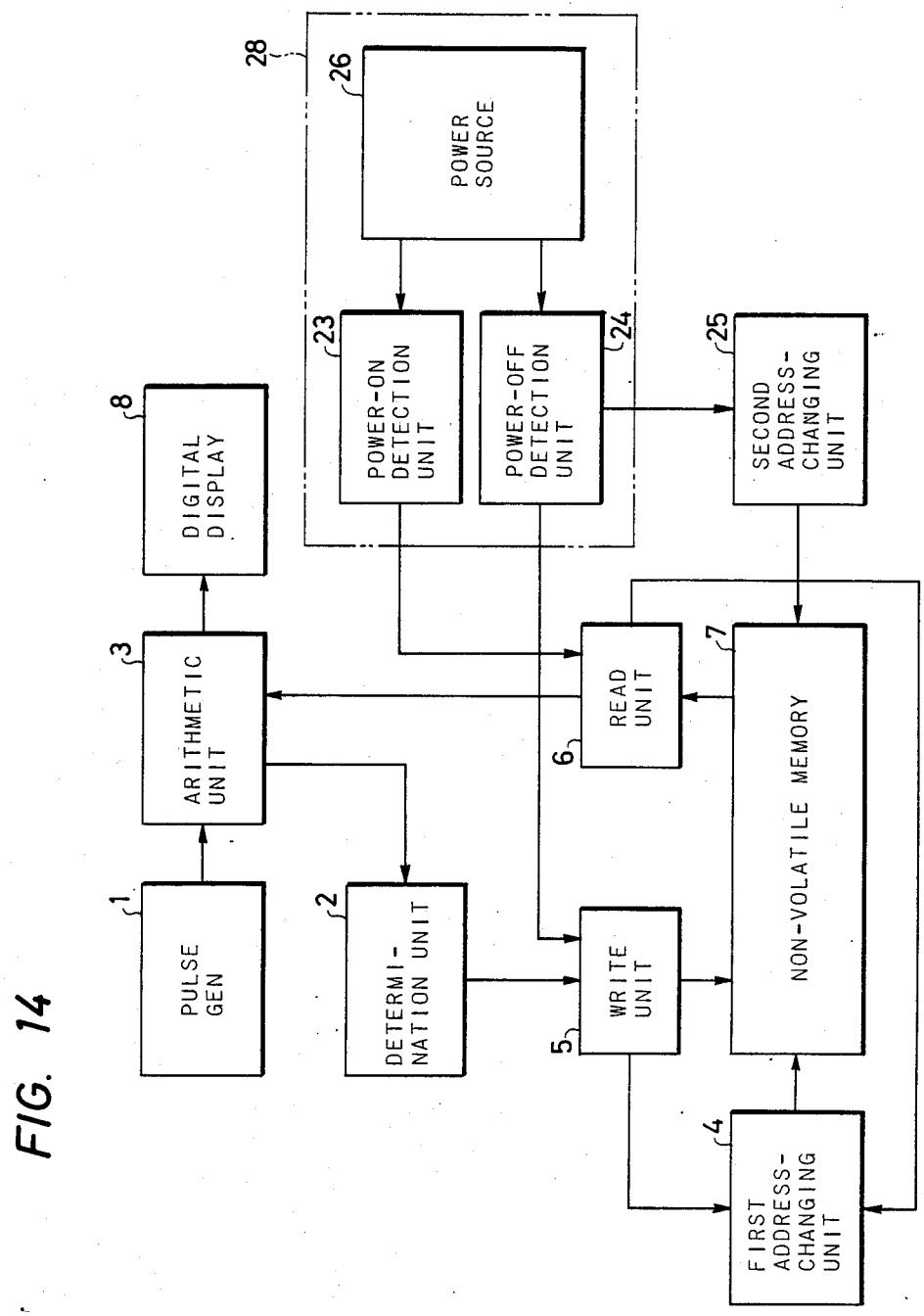
FIG. 14 is a further basic block diagram of the present invention.

Referring to a third basic block diagram of the present invention in FIG. 14 what makes this embodiment different from that of FIG. 1 is the provision of a power source 26, a power-on detection unit 23, and a power-off detection unit 24. In addition, another address in a different area is designated, different from the address indicated by the first address-changing unit 14 that writes the data onto the non-volatile memory 17 every preset distance when the power is on, and the data on total distance traveled is written into that designated other area address when the power is off, so that the data can be written into the non-volatile memory 7 by the second address-changing unit 25 even when the power is off.

Figure 15:
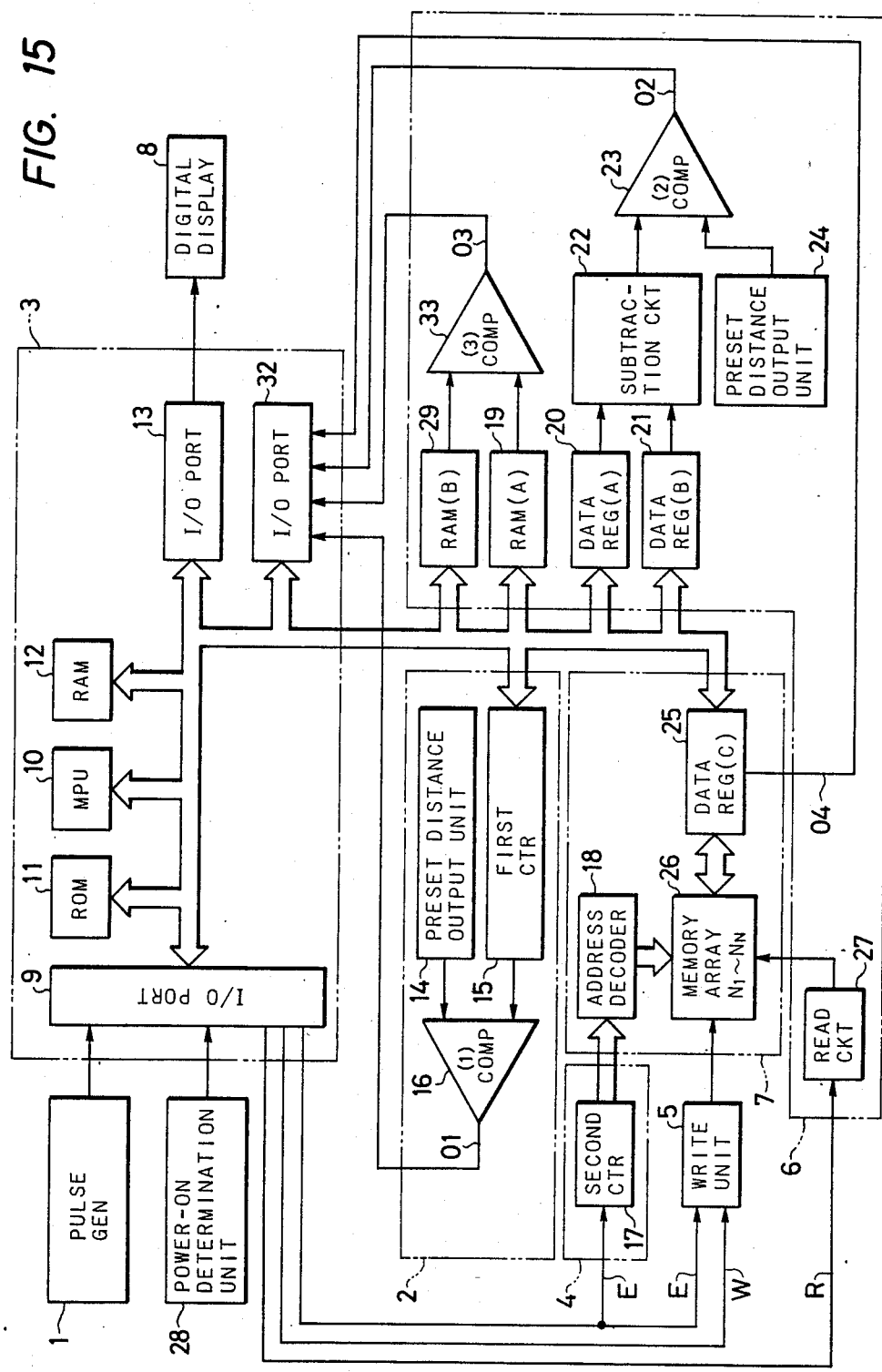
FIG. 15 is a diagram of a specific embodiment of FIG. 14.
Figure 16:
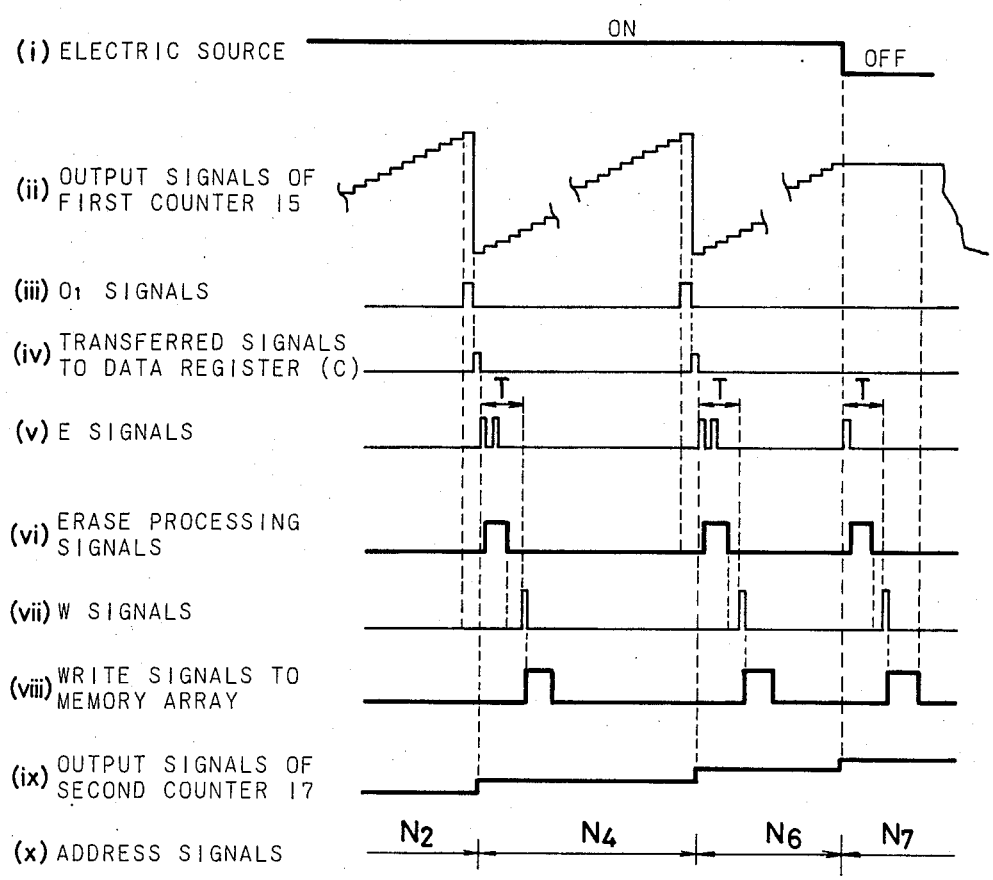
FIG. 16 is a timing chart illustrating the writing operation of the embodiment of FIG. 15.

Referring to FIGS. 15 and 16, the content of the first counter 15 increases according to the distance traveled when the power is on, and a signal $O_1$ is generated every preset distance, The I/O port 9 outputs two pulses at a time to form the signal E, as shown in FIG. 16(v). During this time, the second counter 17 changes in succession while indicating even-numbered addresses, so that the data is written successively into even-numbered addresses of the memory array 26. When the power source 28 is off, the MPU 10 determines that the power is off, and the I/O port 9 outputs one pulse of the signal E as shown in FIG. 16(v). In this case, the second counter 17 is incremented by one. Therefore, the address has an odd number, and the data is written into odd-numbered addresses when the power is off.

When data is to be read out, the power is turned on, and a signal E consisting of two pulses is output, so that a maximum value A measured every preset distance is read out from even-numbered addresses of the non-volatile memory. To read the distance traveled until the power was turned off, the signals E are output from the I/O port 9. That is, only one pulse is output the first time, and two more pulses are output each subsequent time, so that 1, 3, 5 ... pulses are output in sequence, and these are input successively to oddnumbered addresses of the non-volatile memory 7. A maximum value B is then read from the odd-numbered addresses of the memory array 26. The maximum values A, B are each transferred to the data register (A) 20 or the data register (B) 21, and the subtraction circuit 22 subtracts the content of data register (B) 21 from that of data register (A).

The second comparator 23 determines whether the output of the subtraction circuit 22 is less than a certain distance (for example, 2.5 km). If the output of the subtraction circuit 22 is less than that distance, the maximum value B is employed as the initial value for the read-out. If the output of the subtraction circuit 22 is greater than that distance, the maximum value A is employed as the initial value. In this way, the distance traveled until the power was turned off can be indicated. It is also possible to store a fraction (for instance, 20 meters) of the data on distance traveled until the power was turned off, i.e., until the vehicle stopped (when the key was turned off), to further increase the measurement accuracy. Even when erroneous data is input, an increased realiability is maintained for measuring the distance traveled, since the data is written every preset distance.

Figure 17:
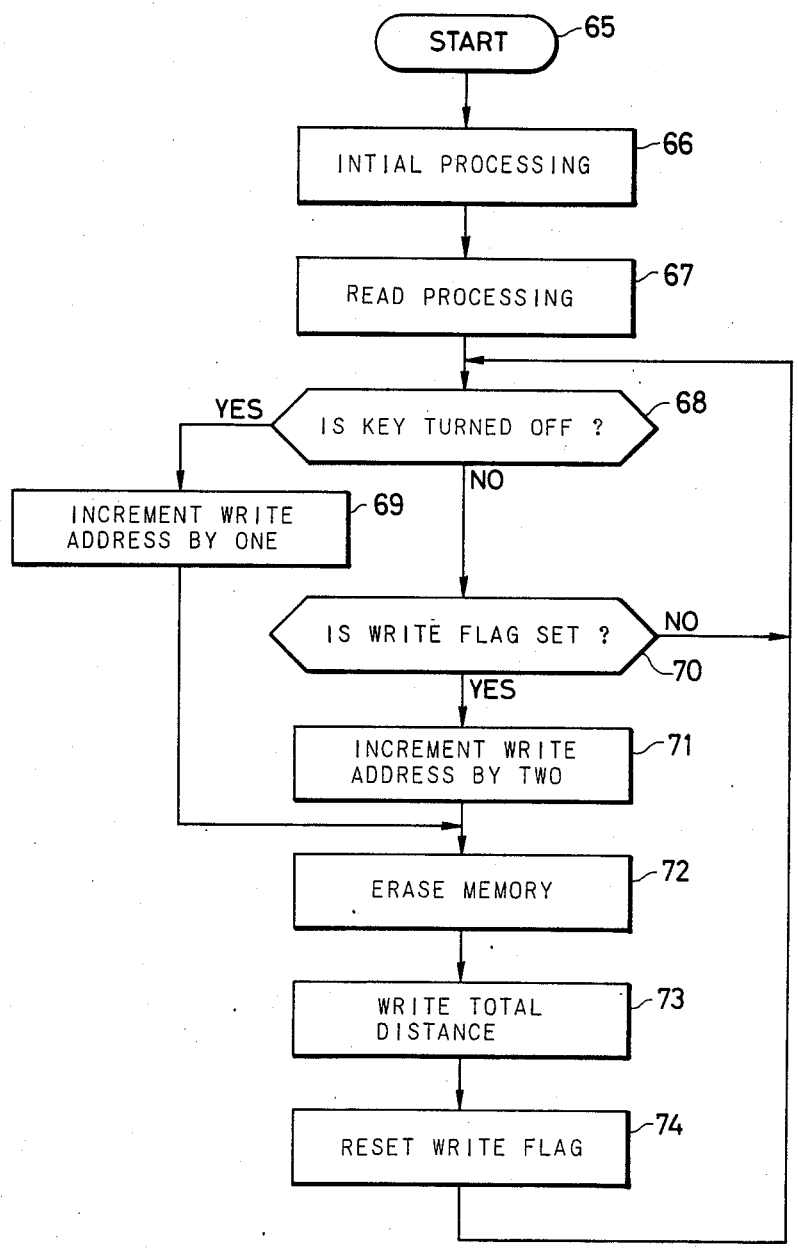
FIG. 17 is a flow chart of an embodiment of a main processing program in the arithmetic unit of FIG. 10.

Referring to the main processing shown in FIG. 17, the initialization of RAM 12 is executed in step 66. The read processing in step 67 is executed by the read circuit 27, details of step 67 are shown in FIG. 19. In step 68, the power-on determination unit 28 determines whether or not the key is turned off, i.e., whether or not the power is on. The power-on determination unit 28 consists, as shown in FIG. 14, of the power source 26, the power-on detection unit 23, and the power-off detection unit 24. When the key is turned off, the signal E is input pulse-by-pulse to the second counter 17, as shown in FIG. 16(v), and, consequently, the address is incremented by one so that the distance traveled is recorded at an odd-numbered address of the memory array 26. If the answer obtained at step 68 is no, the RAM 12 checks in step 70 whether the write flag is set. When it is determined in step 70 that the write flag is set, the signal E is input in two-pulse bursts to the second counter 17 in step 71, as shown in FIG. 16(v), and, consequently, the write address is incremented by two so that the distance traveled is stored in an even-numbered address of the memory array 26. When there is no write flag, the program restarts from step 68. In step 72, the memory is erased by the input of the signal E to the write unit 5. In step 73, the signal W is input to the write unit 5, and data on the total distance is written into the memory array 26. In step 74, the write flag of RAM 12 is reset, and the program goes back to step 68.

In the interrupt processing shown in FIG. 18, the program starts with an interrupt of step 75. In step 76, the number of pulses output by the pulse generator 1 is counted by the MPU 10, and in step 77, the MPU 10 calculates the distance traveled. In step 78, the MPU 10 checks whether or not a preset distance (for example, 100 meters) has been traveled. If the answer obtained by step 78 is yes, the MPU 10 calculates the total distance traveled in step 79. If the answer to step 78 is no, the program proceeds to step 83 and returns to the start of the interrupt in the main processing. In step 80, the total distance traveled is latched and displayed. In step 81, the first comparator 16 checks whether or not a certain distance (for example, 2.5 km) has been traveled. If the answer obtained by step 81 is yes, the RAM 12 resets a distance-write flag in step 82. The program proceeds to step 83 if the answer of the step 81 is no, after step 82 has been finished.

Writing of the total distance data of FIG. 17 is performed in the same manner as in the flow chart of FIG. 7.

Figure 19A:
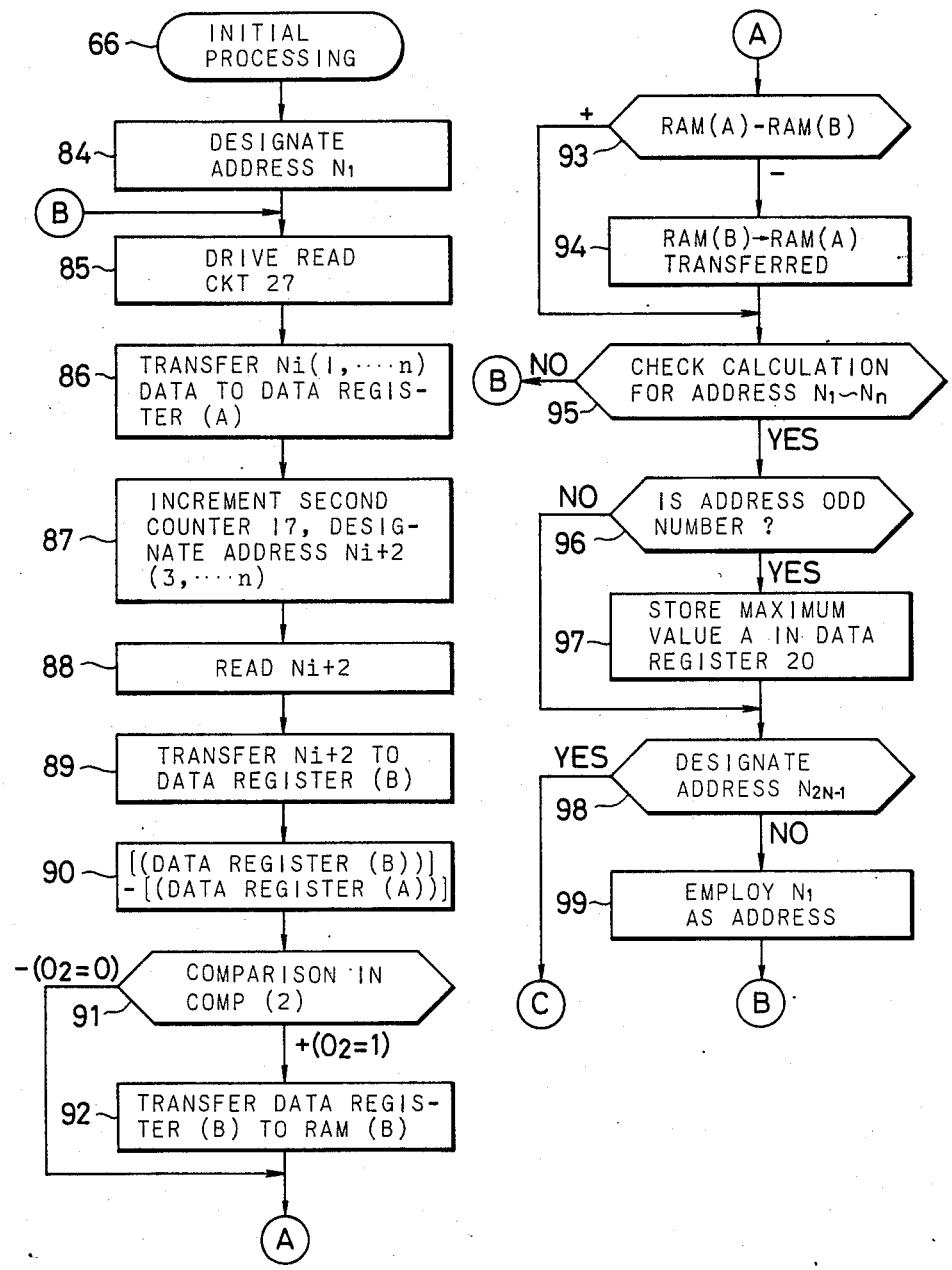
FIGS. 19A–19B are the flow charts of an embodiment of the read processing of the embodiment of FIG. 17.
Figure 19B:
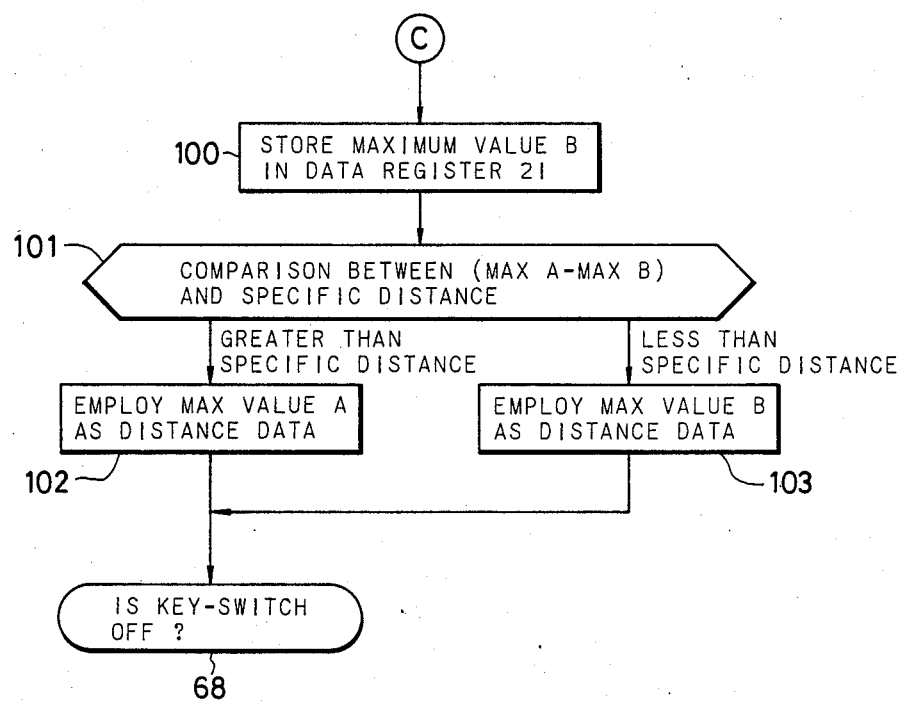

In the read processing of FIG. 19A, steps 84 through 95 are executed in the same manner as steps 46 through 57 of FIG. 8. In FIG. 19, data items $N_i$ and $N_{i+2}$ are successively read out by steps 85 to 89, a maximum value A is read from the even-numbered addresses and is stored in the data register 20 by steps 90 to 97, the addresses are changed to odd-numbered addresses in step 99, and another maximum value is read from the odd-numbered addresses in steps 85 to 95. In step 96, the address is determined to be an odd number, and the program proceeds to step 97.

In step 98, a check is made as to whether the address read out from the non-volatile memory 7 designates an odd-numbered address $N_{2N-1}$. If the result of the check of step 98 is yes, the program proceeds to step 100 of FIG. 19B. In step 100, the maximum value B is stored in the data register 21, and in step 101, the second comparator 23 performs a comparison. If the result of step 101 proves that the output of the second comparator 23 is greater than a certain distance (for example, 2.5 km), the maximum value A is employed as distance data in step 102. If the output of the second comparator 23 is less than that distance, the maximum value B is employed as distance data in step 103.

According to the present invention as described above, an electronic odometer is provided which is capable of extending the life of a non-volatile memory therein, and which is capable of accurately indicating the total distance traveled by a vehicle.

What is claimed is:

1. An electronic odometer comprising:

arithmetic means connected to receive data of a distance traveled for calculating the distance traveled;

determination means connected to said arithmetic means for determining whether a preset distance has been traveled;

a non-volatile memory having N addressable storage locations into which data of distance traveled is written one-by-one every time said preset distance is traveled;

address-changing means for sequentially selecting the N addressable storage locations of said non-volatile memory;

writing means responsive to an output of said preset distance determination means for writing the distance calculated by said arithmetic means in one of the sequentially selected addressable storage locations in said non-volatile memory every time said preset distance is traveled;

reading means responsive to said arithmetic means for reading out data written into said non-volatile memory and for inputting said data to said arithmetic means; and display means for displaying the results calculated by said arithmetic means, wherein said address-changing means is provided with a first address-changing means and a second address-changing means, said non-volatile memory is divided into indirect address storage locations for storing addresses and data storage locations for storing data corresponding to each indirect address, said reading means is provided with a first reading means and a second reading means, said first reading means and said first address-changing means are responsive to an output from said preset distance determination means, the indirect address data is read out by said first reading means and input to said second address-changing means so that said second address-changing means selects the next address of said indirect address storage locations and the distance traveled is written into a data storage location by said writing means, the data thus written is read out by said second reading means, said distance is compared by a comparator circuit with previous data to determine whether they are equal to each other, and, when they are not equal, the data of said indirect address storage location is changed to a new address by said first address-changing means so as to not use a failed address and a new distance traveled is written by said writing means into a new data storage location.

2. The electronic odometer according to claim 1, wherein said reading means is provided with means for selecting a maximum value from data indicating the total distance traveled, which data is stored in said non-volatile memory; and further including means for determining whether the difference between said maximum value and the previous data stored immediately before said maximum value is equal to said preset distance; wherein when said difference is equal to said preset distance traveled, said maximum value is input to said arithmetic means; but when said difference is not equal to said preset distance, said determining means determines whether the difference between said previous data stored immediately before said maximum value and the data stored immediately before said previous data is equal to said preset distance, so that when that difference is equal to said preset distance, said data stored immediately before said maximum value is input to said arithmetic means; but when that difference is not equal to said preset distance, the same determination is repeated for subsequent previous data until the difference becomes equal to said preset distance traveled, and the data is input to said arithmetic means.

3. The electronic odometer according to claim 2, including power-off determination means; said first address-changing means being operated by the output of said preset distance determination means through said writing means, and said distance traveled is written into said non-volatile memory according to the address determined by said first address changing means, wherein said second address changing means is operated by the output of said writing means through said power-off determination means for writing the distance at the time of power-off into said non-volatile memory according to the address which is determined by said second address changing means, and wherein said second address changing means selects even numbered addresses which are different from the odd-numbered addresses selected by said first address changing means.

4. The electronic odometer according to claim 3, wherein said reading means is provided with means which reads data when an output is generated by a power-on determination means, said reading means selects a maximum value A from said even numbered addresses written according to said second address-changing means and also selects a maximum value B from preset distance data from storage locations indicated by said odd numbered addresses written according to said first address-changing means, and when a value obtained by subtracting said maximum value B from said maximum value A is less than said preset predetermined distance and has a positive value, said reading means reads out said maximum value A from said even numbered address storage locations, otherwise said reading means reads out said maximum value B from said odd numbered address storage locations and inputs said read value to said arithmetic means.

5. An electronic odometer comprising:

arithmetic means connected to receive data of a distance traveled for calculating the distance traveled;

determination means connected to said arithmetic means for determining whether a preset distance has been traveled;

a non-volatile memory having N addressable storage locations into which data of distance traveled is written one-by-one every time said preset distance is traveled;

address-changing means for sequentially selecting the N addressable storage locations of said non-volatile memory;

writing means responsive to an output of said preset distance determination means for writing the total distance calculated by said arithmetic means in one of the sequentially selected addressable storage locations in said non-volatile memory every time said preset distance is traveled;

reading means responsive to said arithmetic means for reading out data written into said non-volatile memory and for inputting said data to said arithmetic means; and display means for displaying the results calculated by said arithmetic means, wherein said reading means is provided with means for selecting a maximum value from data of distance traveled which is stored in said non-volatile memory and for determining whether the difference between said maximum value and the previous data stored immediately before said maximum value is equal to said preset distance, and wherein, when said difference is equal to said preset distance traveled, said maximum value is input to said arithmetic means, but when said difference is not equal to said preset distance, said reading means determines whether the difference between said previous data stored immediately before said maximum value and the data stored immediately before said previous data is equal to said preset distance, so that when that difference is equal to said preset distance, said data stored immediately before said maximum value is input to said arithmetic means, but when that difference is not equal to said preset distance, the same determination is repeated for the subsequent previous data until the difference becomes equal to said preset distance traveled, and the data is input to said arithmetic means.

6. The electronic odometer according to claim 5, wherein said address-changing means is provided with a first address-changing means, a second address-changing means, and a power-off determination means; said first address changing means being responsive to the output of said preset distance determination means through said writing means for writing said distance traveled into said non-volatile memory according to the address determined by said first address changing means, and wherein said second address changing means is responsive to the output of said writing means through said power-off determination means for writing the distance at the time of power-off into said non-volatile memory according to the address which is determined by said second address changing means, wherein said second address changing means selects even numbered addresses which are different from odd-numbered addresses selected by said first changing means.

* * * * *